United States Patent [19]

Levinos

[11] 4,012,256

[45] Mar. 15, 1977

[54] PHOTO-IMAGING UTILIZING ALKALI-ACTIVATED PHOTOPOLYMERIZABLE COMPOSITIONS

[75] Inventor: Steven Levinos, Chatham, N.J.

[73] Assignee: Keuffel & Esser Company, Morristown, N.J.

[22] Filed: Sept. 25, 1972

[21] Appl. No.: 291,851

[52] U.S. Cl. .............................. 96/35.1; 96/115 P; 96/27 R
[51] Int. Cl.$^2$ ...................... G03C 5/00; G03C 1/68
[58] Field of Search .................... 96/35.1, 27, 115 P

[56] References Cited

UNITED STATES PATENTS

| | | | |
|---|---|---|---|
| 3,097,097 | 7/1963 | Oster et al. .......................... | 96/35.1 |
| 3,418,118 | 12/1968 | Thommes et al. ................... | 96/35.1 |
| 3,495,987 | 2/1970 | Moore ................................. | 96/35.1 |

OTHER PUBLICATIONS

Chaberek et al, "The Journal of Physical Chemistry", vol. 69, No. 2, Feb. 1965, pp. 647–656.

*Primary Examiner*—Jack P. Brammer
*Attorney, Agent, or Firm*—Lionel N. White

[57] ABSTRACT

A photopolymerizable composition useful in photo-imaging processes comprises an ethylenically unsaturated polymerizable compound and a photo-initiator comprising a combination of a photoreducible dye and an alkanolamine. The composition is substantially insensitive to visible light when in an acidic pH condition, yet may be made highly sensitive to visible light upon adjustment to a condition of alkaline pH. Imaging materials may be repeatedly sensitized and desensitized by pH adjustment and multiple-spaced exposures made prior to final washoff development processing.

4 Claims, No Drawings

PHOTO-IMAGING UTILIZING ALKALI-ACTIVATED PHOTOPOLYMERIZABLE COMPOSITIONS

BACKGROUND

Numerous photopolymerizable coating compositions are known which may be used to make photo-imaging materials that are insensitive to light in the visible region of the spectrum and which may, therefore, be handled under conditions of ambient daylight or fluorescent illumination. Although preferred in copying processes, other materials which are sensitive to visible radiation must be protected from ambient illumination in order to prevent premature, indiscriminate polymerization in the photosensitive composition. Dye sensitized photopolymerizable layers such as disclosed in U.S. Pat. Nos. 2,875,047 and 3,573,922 may be handled under ambient illumination; however, such manipulation without safelight conditions must necessarily be limited to very short periods in order to ensure against formation of non-image polymerization, or "fog".

Common to most photo-imaging systems is the requirement that the photosensitive material be capable of inactivation subsequent to imagewise light exposure in order to "fix" the resulting image. Several methods of fixing have been previously employed, such as washing to remove active ingredients or deactivating such components with heat or chemical agents. The usual result of these procedures is that the imaging materials are limited to "one-shot" utility, since they are photosensitive until a first imaging exposure and are thereafter "fixed" against any further imaging capability.

SUMMARY

The present invention provides photo-imaging material and a process of photo-imaging whereby a potentially photopolymerizable composition which is substantially insensitive to visible light may be rendered temporarily sensitive to such radiation in a simple activating step and after imagewise light exposure will revert, without significant additional treatment, to the normal inactive state. A particular advantage in this invention is the continuing reversibility of the sensitivity of the composition which provides a means for applying images to a single sheet at widely spaced times, a capability which, for example, finds great utility in record updating.

In accordance with the present invention, polymerization of vinyl monomers is accomplished by exposing a monomer or mixture of monomers to actinic radiation in the presence of a photoinitiator comprising a photoreducible dye and an aromatic or aliphatic alkanolamine. An alkaline environment is required to support a useful rate of polymerization. For instance, acrylamide in aqueous solution with a cross-linking agent is converted to a hard, polymeric mass in a matter of seconds by exposure to light in the presence of such a photoinitiator composition when the mixture is maintained on the alkaline side. As small incremental amounts of acid are added, the onset of polymerization is considerably retarded until, at a pH of about 4.0 to 4.5, all practical sensitivity to actinic radiation is lost.

Materials prepared by coating a layer of such an acidified composition on a suitable support are insensitive to visible actinic radiation. They may be sensitized by adjusting the pH to the alkaline side by merely fuming with moist ammonia as, for example, by passing a sheet through the developing chamber of a conventional diazo white-print machine. An imagewise exposure then made employing a 500-watt GE Photoflood lamp as the light source effects polymerization in the light-struck portions of the coated composition. When next stored in darkness to allow the ammonia to diffuse out of the coating, the sheet once again assumes its light-insensitive state and thereafter can be handled under ambient lighting without adverse effects (fogging). Removal of ammonia from the coating may be accelerated by mild heating, e.g., at 40° C for about one minute. After this stabilizing step, the coating may again be sensitized by fuming with moist ammonia, as before, and another imagewise exposure made in previously non-exposed areas. After a plurality of imagewise exposures have been made, each preceded by ammonia sensitization, remaining unexposed areas may be simply removed by a water wash at about 30°–35° C to yield a like plurality of polymeric relief images, each corresponding to the previous respective imagewise light exposures. If the mixture was not initially pre-pigmented or pre-dyed, the relief images are rendered distinctly visible by a post-dyeing step.

In procedures where it is desirable to repeatedly examine a record sheet during the time span in which periodic image entries are being accumulated on the sheet, it is not practical to employ washout development until such time as the sheet is imaged to spacial capacity. Record examination under such circumstances may, however, be very effectively accomplished through the use of a Schlieren optical system. The polymeric image is thus made readily visible for temporary perusal or the preparation of interim copies.

DESCRIPTION

Any normally liquid or solid photopolymerizable unsaturated compound is useful in the practice of the present invention. Preferably, such compounds should be ethylenically unsaturated, i.e., contain at least one non-aromatic double bond between adjacent carbon atoms. Compounds particularly advantageous include vinyl or vinylidene compounds containing a $CH_2=C<$ group activated by direct attachment to a negative group such a halogen, $<C=O$, $-C\equiv N$, $-C\equiv C-$, $-O-$, or aryl. Examples of photopolymerizable compounds include acrylamide, diacetone acrylamide, N-methylolacrylamide, N-isopropyl acrylamide, acrylonitrile, acrylic acid, methacrylic acid, methacrylamide, N-vinyl pyrrolidone, N-vinyl carbazole, hydroxyethyl methacrylate, barium acrylate, barium methacrylate, zinc acrylate, calcium acrylate, magnesium acrylate, itaconic acid esters, sodium or ammonium acrylates, and the like.

The ethylenically unsaturated compounds may be used either alone or in admixture in order to vary the physical properties of the final polymer. Thus, in order to produce a polymer of the desired physical characteristics, it is a recognized practice to polymerize the vinyl monomer in the presence of a small amount of an unsaturated compound having at least two terminal vinyl groups each linked to a carbon atom in a straight chain or in a ring. The function of such compounds is to cross-link the polyvinyl chains. Cross-linking agents which can be utilized for the purposes described herein include N,N'-methylenebisacrylamide, triallyl cyanurate, divinyl benzene, divinyl ketones, and diglycol diacrylate. Other difunctional monomers which can also be used advantageously include zinc, calcium, barium or magnesium acrylates. Generally, increasing the quantity of cross-linking agent increases the hardness of the polymer obtained. The quantity of cross-linking agent may desirably range from about 2 to 10 parts for 100 parts of monomer.

The photoreducible dyes which may be used as components of the photo-initiator in the present invention are those dyes which are capable of forming a stable system with an electron donor in the absence of light and which will undergo reduction when irradiated with visible light in the presence of the electron donating component. Such photoreducible dyes includes rose bengal, erythrosine, eosin, fluorescein, acriflavine, thionin, methylene blue, riboflavin, and the like. The dyes may be used individually or in admixture to increase sensitivity over a wider range of the visible spectrum.

While the concentration of dye is not critical, the most efficient results are obtained when the concentration is adjusted so that at least 90% of the incident light is absorbed at the wavelength corresponding to the absorption maximum of the particular dye employed.

The alkanolamines used as the remaining component part of the photocatalyst are very stable compounds, but are capable of reacting with the photoexcited dyes (electron acceptors) to produce free radicals by a redox reaction. It is apparently these photogenerated free radicals which initiate the polymerization reaction.

Aromatic and aliphatic alkanolamines suitable for the purposes of this invention include N-phenyldiethanolamine, triethanolamine, diethanolamine, monoethanolamine and derivatives thereof. One example of a useful derivative is a coco amine adduct with 15 moles of ethylene oxide, which is marketed by the Ashland Chemical Company as Arosurf 160E-15. The coco amine in this case has a minimum primary amine content of 95%. Another useful product is Polycomplex Q, a coconut fatty acid alkanolamide, manufactured by the Guardian Chemical Corporation. A coconut fatty acid diethanolamide, P&G Amide No. 72 marketed by Proctor and Gamble is another useful derivative. The diethanolamide salt of lauryl alcohol sulfate is still another compound that may be used for the purpose of this invention and is marketed by the DuPont Company as Duponol EP.

The alkanolamines form stable salts with acids such as nitric, hydrochloric, sulfuric, and sulfamic, and these acids are useful for the initial pH adjustment of the mixture prior to coating. The primary, secondary, or tertiary amines are used on the basis of a few percent by weight of the monomer or monomers employed.

In preparing photo-imaging materials according to the invention, it has been found advantageous to use a hydrophilic colloid as a carrier or binder for the mixture of monomer, photocatalyst, and the other desired additives. Suitable colloids for this purpose include polyvinyl alcohol, gelatin, casein, glue, saponified cellulose acetate, carboxymethyl cellulose, starch, and the like. Gelatin is a preferred colloid in that it not only serves as a binder material but, in addition, serves as a backbone on which the polymer is grafted as it is being formed from the monomer present in the light-sensitive composition.

Although it is preferable to carry out polymerization in a water-based formulation, an organic solvent system may also be employed. In this case, provisions should be made for the presence in the system of a small quantity of water, e.g., about 0.1 to 5% by weight. The water may be added as such or may be supplied by incorporation in the reaction mixture of a humectant such as glycerin, trimethylolpropane, ethylene glycol, diethylene diglycol, or mixtures thereof.

PREFERRED EMBODIMENTS

EXAMPLE 1

A monomer solution of the following composition was prepared:

| | |
|---|---|
| Acrylamide | 90 gms. |
| N,N'-methylenebisacrylamide | 5 gms. |
| Deionized water | 60 ml. |

To 20 ml. of this solution was added enough of a 10% solution of Arosurf 160-E15 coco amine adduct (pH = 9.3) to adjust the pH of the mixture to 8.3. A few drops of a 0.2% aqueous solution of methylene blue were then added. A 5 ml. portion of this mixture in a 13 × 100 mm. test tube was then irradiated with a 500-watt GE Photoflood lamp positioned at a distance of about 25 cm. Polymerization of the monomer ensued after a period of 18 seconds. Solid citric acid was next added to the remaining 15 ml. of the mixture to adjust the pH to 3.8. No polymer was formed after a period of 20 minutes when a 5 ml. portion was irradiated as before. The pH of the remaining mixture was next adjusted to 6.3 with dilute ammonium hydroxide. Polymer was formed when a 5 ml. portion was irradiated for 5 minutes as before. Finally, additional dilute ammonium hydroxide was added to the last 5 ml. portion of the mixture to bring the pH to the alkaline side. When irradiated as before, polymerization took place within a matter of a few seconds.

EXAMPLE 2

To 30 ml. of the monomer composition of Example 1 was added enough aqueous 50% diethanolamine to adjust the pH to a value of 9.3. Five drops of a 0.2% aqueous solution of methylene blue and three drops of a 0.2% aqueous solution of rose bengal were added. Polymer was observed to form after irradiating a 5 ml. portion for 35 seconds as in the preceding example. The remainder of the mixture was then adjusted to a pH of 4.35 with a 25% aqueous solution of sulfamic acid. No polymer was formed after irradiating a 5 ml. portion, as before, for a period of 10 minutes. The remaining mixture was finally adjusted by the dropwise addition of concentrated ammonium hydroxide to its initial pH value of 9.3. When a 5 ml. portion of this mixture was exposed to light as in the preceding tests, polymer formation took place after 21 seconds.

EXAMPLE 3

A black-colored coating composition was prepared as follows: 9.0 gm. gelatin (inert, high bloom) and 1.5 gm. polyvinyl pyrrolidone (med. visc.) were dissolved in 100 ml. of deionized water. 1.75 gm. of the chlorozincate salt of 1-diazo-2,5-dimethoxy-4-p-tolylmercapto-benzene were added with stirring to effect complete dissolution of the solid. This was followed by the dropwise addition over a 20 minute period of a solution comprised of 0.7 gm. phloroglucinol, 0.65 gm. 8-hydroxyquinoline, and 5.0 gm. N-phenyldiethanolamine dissolved in 100 ml. of a 1:1 mixture of denatured ethanol and water. Coupling of the diazonium salt with phloroglucinol formed a black pigment. There was then added with continued stirring a solution of 4.2 gm. acrylamide and 0.8 gm. N,N-'-methylenebisacrylamide dissolved in 50 ml. of deionized water. Five ml. of 20% aqueous solution of sodium dodecyl benzene sulfonate were then added, followed by 2 ml. of a 0.5% aqueous solution of methylene blue. Apparently due to the acidity of the diazonium salt employed, the pH of the completed formulation was 4.5 and further downward adjustment was not required.

The composition was divided into two parts. One was retained as composition A and the other was modified by the addition of 2.5 ml. of a 0.2% aqueous solution of rose bengal. This latter solution was designated as composition B. Each formulation was then coated on a subbed, matte surface, polyester film base, commonly used for drafting work, by means of a vertical loop meniscus coater at a speed of about 4 cm. per second. Both coatings were allowed to dry in darkness.

A section of coating A was fumed with ammonia for 3 minutes by placing it coating side downward over a beaker containing a few ml. of concentrated ammonium hydroxide. After placing it in contact with a line negative, it was exposed in a printing frame for about 3 minutes to the light of a 500-watt GE Photoflood lamp positioned at a distance of about 30 cm. The exposed layer was then washed with water at a temperature of about 30° C with mild finger rubbing whereupon a positive image was obtained. When another section of the coating was exposed as before, but without prior fuming with ammonia, there was no discernible image after the washout step.

EXAMPLE 4

A section of coating B prepared in Example 3 was given a 4 minute imagewise exposure without prior fuming with ammonia. There was no discernible image after the washout step.

EXAMPLE 5

Another section of coating B was fumed with ammonia for 1.5 minutes. A good positive print was obtained after a 3 minute exposure and wash with water at about 30° C.

EXAMPLE 6

A section of coating B was exposed imagewise to ambient fluorescent illumination for 16 hours without prior fuming with ammonia. There was no discernible image after the washout step.

EXAMPLE 7

Another section of coating B was fumed with ammonia for 1.5 minutes and then given a 3 minute imagewise exposure as before. The sheet was then heated in a 40° C oven for 1 minute. Thereafter, the sheet was given a 3 minute exposure of a different image using the same light source. Only a single image corresponding to the first exposure was evident after washout processing.

EXAMPLE 8

A section of coating B was fumed with ammonia as in Example 7, given a 3 minute imagewise exposure and then heated in a 40° C oven for one minute. The sheet was then fumed with ammonia once again and given a different 3 minute imagewise light exposure as before. Two different images corresponding to the separate exposures became evident after the washout step.

EXAMPLE 9

A portion of composition B was adjusted to a pH of 5.5 with dilute sodium hydroxide and then coated on film base as in Example 3. After drying, a section, without prior fuming with ammonia, was given a 4 minute imagewise exposure. A faint image, as compared with no discernible image under conditions of Example 4, was obtained after the washout step.

EXAMPLE 10

A composition of the following formulation was prepared in the general manner of Example 3:

| | |
|---|---|
| Gelatin (inert, high bloom) | 9.0 g. |
| Polyvinyl pyrrolidone (med. visc.) | 1.5 g. |
| Deionized water | 100.0 ml. |
| Acrylamide | 4.2 g. |
| N,N'-methylenebisacrylamide | 0.8 g. |
| Deionized water | 50.0 ml. |
| Coco amine adduct (160-E 15) | 50.0 ml. |
| Methylene blue (0.5% aq. sol.) | 1.0 ml. |
| Rose bengal (0.5% aq. sol.) | 1.0 ml. |
| Trimethylolpropane (50% aq. sol.) | 2.0 g. |
| Glycerin | 2.0 g. |

The resulting mixture was substantially colorless, lacking the pigmenting components of Example 3, and exhibited a pH of about 7.2. Sufficient sulfamic acid (10% sol.) was added to reduce the pH of the composition to about 4.2 and a coating of about 125 microns wet thickness was applied to a subbed polyester film and dried in darkness overnight.

The sheet material thus prepared was employed over the period of a day to prepare a number of images in the following manner:

A section of the coated composition of the material was fumed with ammonium hydroxide vapors for about 60 seconds and the section was then exposed for about 30 seconds to a first light image from a 500-watt photoflood lamp at a distance of about 30 cm. The exposed sheet was then placed in the substantial darkness of a file cabinet for about 6 hours after which it was removed and immediately, without ammonia fuming, was similarly exposed in a different section to a second light image from the same source. After another period of simulated file storage, the sheet was again fumed in a third section with the ammonia vapors and then exposed to a third light image under the previous conditions. Once again the sheet was placed in file storage at ambient conditions for the remainder of the day.

Subsequently, the exposed sheet was viewed in a Schlieren optical system in the light of He-Ne laser. The images corresponding to the first and third light exposures were distinctly visible, yet there was no apparent image of the second exposure. Still later, the sheet was subjected to washout development with water and the presence only of the first and third images was confirmed.

What is claimed is:
1. The method of forming a polymeric image which comprises:
   a. providing photo-imaging material comprising a support and a coating thereon of a composition comprising an ethylenically unsaturated polymerizable compound, a photo-initiator comprising the combination of a photoreducible dye and an alka- nolamine, and sufficient acid to normally maintain said composition at a pH value below about 4.5, thereby rendering said material substantially insensitive to visible light;

b. alkalizing at least a section of the coated composition of said material to render the pH value of said composition section greater than about 7.0; and c. exposing imagewise to visible light said alkalized composition section, thereby effecting polymerization of said composition in light-exposed areas.

2. The method of forming a stable polymeric image which comprises:

a. providing photo-imaging material comprising a support and a coating thereon of a composition comprising:
   1. an ethylenically unsaturated polymerizable compound,
   2. a photo-initiator comprising the combination of a photoreducible dye and an alkanolamine, and;
   3. sufficient acid to normally maintain said composition at a pH value below about 4.5, thereby rendering said material substantially insensitive to visible light;

b. alkalizing at least a section of the coated composition of said material to render the pH value of said composition section greater than about 7.0;

c. exposing imagewise to visible light said alkalized composition section, thereby effecting polymerization of said composition in light-exposed areas; and d. fixing said polymeric image by effecting a reduction in the pH value of the alkalized section of said composition to below about 4.5.

3. A method according to claim 2 wherein said alkalizing step comprises exposing said composition section to alkaline vapors, and said fixing step comprises effecting removal of said vapors from said composition.

4. A method according to claim 3 wherein said alkaline vapors comprise ammonia.

* * * * *